(12) United States Patent
Lucarini et al.

(10) Patent No.: US 7,101,817 B2
(45) Date of Patent: Sep. 5, 2006

(54) SYSTEM AND METHOD FOR DETERMINING LINE WIDTHS OF FREE-STANDING STRUCTURES RESULTING FROM A SEMICONDUCTOR MANUFACTURING PROCESS

(75) Inventors: Stephen M. Lucarini, Pleasant Valley, NY (US); Karl W. Barth, Beacon, NY (US); Stephen K. Loh, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,350

(22) Filed: Nov. 5, 2004

(65) Prior Publication Data

US 2006/0099832 A1    May 11, 2006

(51) Int. Cl.
- *H01L 21/26* (2006.01)
- *H01L 21/42* (2006.01)
- *H01L 21/324* (2006.01)
- *H01L 21/477* (2006.01)

(52) U.S. Cl. .................. 438/795; 438/14; 438/799
(58) Field of Classification Search .............. 438/14, 438/29, 795, 799, 907, 935
See application file for complete search history.

(56) References Cited

U.S. PATENT DOCUMENTS

| 5,414,265 | A | 5/1995 | Sartore ................ 250/310 |
| 5,821,175 | A | 10/1998 | Engelsberg ............ 438/795 |
| 2003/0148024 | A1* | 8/2003 | Kodas et al. .......... 427/125 |

OTHER PUBLICATIONS

James F. Weygand, et al. *Cleaning silicon wafers with an argon/nitrogen cryogenic aerosol process.* 14 pages. Accessed Jun. 17, 2004 at http://www.micromagazine.com/archive/97/04/wegland.html.

FSI International, Inc. *Glossary.* Accessed Jun. 17, 2004 at http://www.fsik-intl.com/products/glossary.php.

* cited by examiner

*Primary Examiner*—Phuc T. Dang

(74) *Attorney, Agent, or Firm*—Lisa U. Jaklitsch

(57) ABSTRACT

A apparatus and method for determining minimum line widths of free standing structures built by a semiconductor (S/C) manufacturing process. Free standing structures are created in a semiconductor device and subjected to an aerosol process which is tuned and centered with respect to a critical line width for the free standing structures. The S/C manufacturing process is tuned responsive to failure of free standing structures of sub-critical line widths.

7 Claims, 13 Drawing Sheets

SYSTEM AND METHOD FOR DETERMINING LINE WIDTHS OF FREE-STANDING STRUCTURES RESULTING FROM A SEMICONDUCTOR MANUFACTURING PROCESS

BACKGROUND OF INVENTION

This invention relates to semi-conductor manufacturing processes, and more particularly to an aerosol process for inspecting free standing structures.

As minimum semiconductor design feature sizes decrease from 90 nm to 65 nm to 40 nm, structures such as those created by traditional lithography-etching become mechanically less and less stable. Unstable structures will cause defects that result in electrical opens or shorts, preventing circuit operation. The use of new ultra short wavelength lithography/resist systems makes across chip line width variation (ACLV) control difficult, such that lines within a chip, or portions of such lines, can easily be 10% smaller than the average. The necessity for on-mask corrections further compounds the problem, because imperfect optical proximity correction (OPC), which compensates a design for lithographic image variation due to local environment, actually can make the local line variation worse.

The industry has relied predominately on electrical and critical dimension measurements via scanning electron microscopy (SEM) to determine average line widths across a chip or wafer. Realistically, measurements are preformed on structures in nested, semi-nested and isolated local environments that mimic the product chip to obtain a fairly good understanding the line widths on the product chip.

Ideally, all local environments should be measured on a product chip or wafer to ensure an accurate understanding of line width. Since this is not feasible, line width variations and/or failures may exist and will ultimately be detected in the product through electrical characterization and subsequent failure analysis. This procedure, however, is a costly, time consuming, and resource intensive solution.

Thus there is a need in the art for an improved method for identifying specific regions on a wafer or chip where free standing structures of a specific width, such as poly-Si gates, resist trenches, or trenches in a low K material such as SiLK, fail to maintain structural integrity.

SUMMARY OF INVENTION

A system and method are provided for determining minimum line widths of free standing structures built by a semiconductor (S/C) manufacturing process, by creating free standing structures in a semiconductor device; tuning and centering an aerosol process with respect to a critical line width for the free standing structures; subjecting the device to the aerosol process; and responsive to failure of free standing structures of sub-critical line widths, selectively tuning the S/C manufacturing process.

Other features and advantages of this invention will become apparent from the following detailed description of the presently preferred embodiment of the invention, taken in conjunction with the accompanying drawings.

DETAILED DESCRIPTION

In accordance with the preferred embodiment of the invention, a tunable aerosol system and method is provided for identifying specific regions on a wafer or chip where free standing structures fail to maintain structural integrity. The occurrence of some type of physical disturbance on these structures resulting from the aerosol clean process can be correlated to line width.

With this aerosol process, "at level" knowledge of problem areas on a wafer or chip may be derived with a dramatically reduced mean time to problem detection. This aerosol process may be used after key process steps in making a wafer or chip which, when combined with Process Limited Yield (PLY) inspections and/or electrical tests, will help identify such problem areas, particularly with respect to line widths of free standing structures. Such key process steps include litho develop, PC mask open, PC etch, dielectric etch, and the like. In the following example, an aerosol process is performed after free-standing poly-silicon lines are deposited on a wafer.

Figure 1:
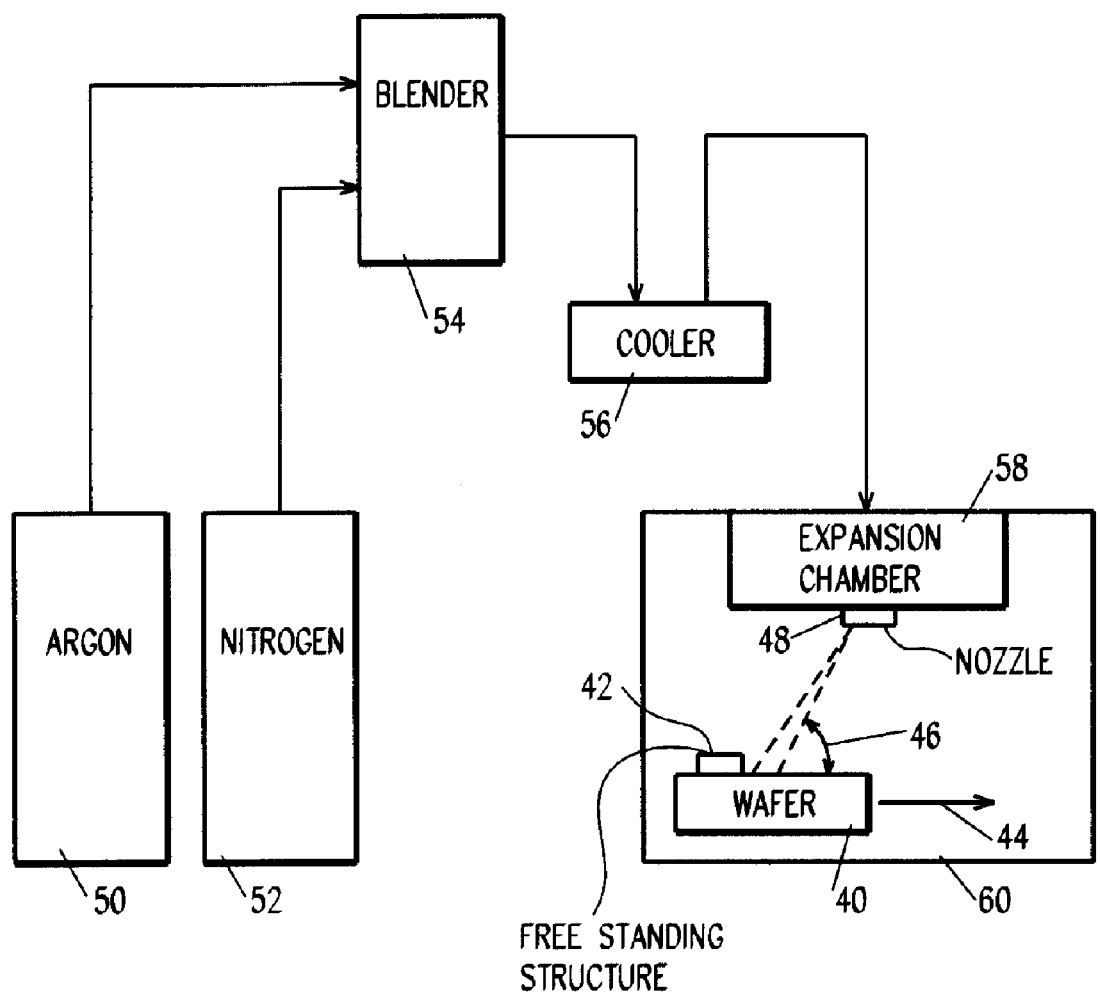
FIG. 1 is a schematic representation of exemplary aerosol process equipment for use in the preferred embodiment of the invention.
Figures 2, 2A:
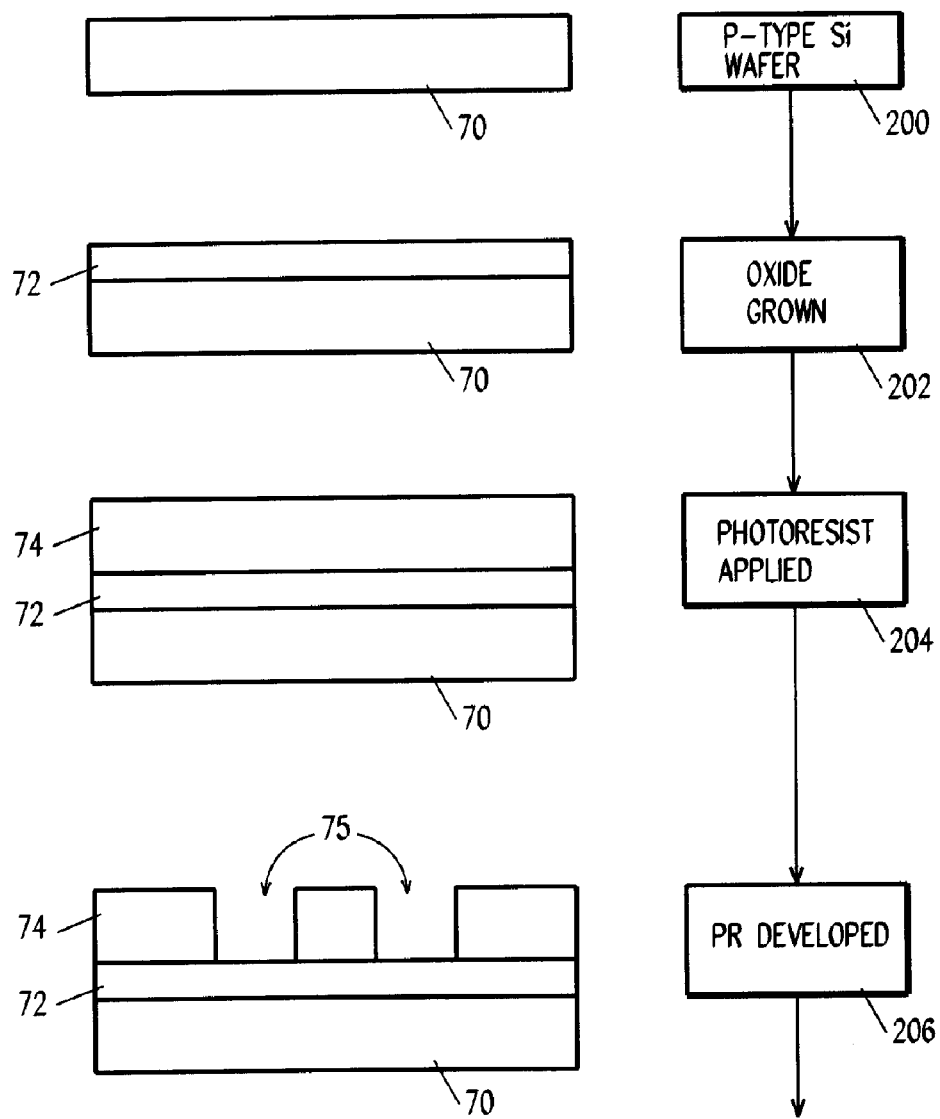
FIGS. 2A through 2G are a flow diagram and schematic representation of a typical semi-conductor manufacturing process.
Figure 2B:
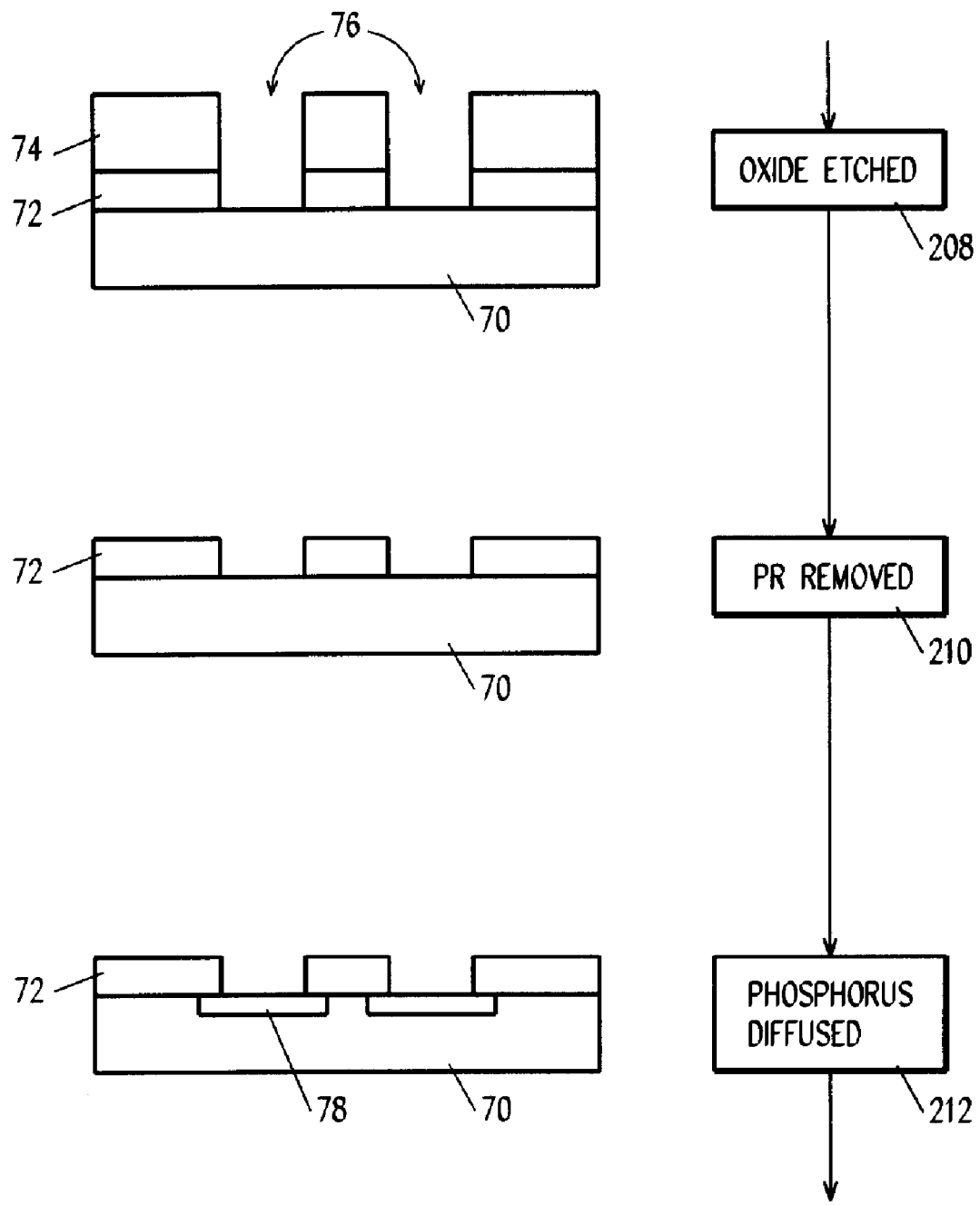
Figure 2C:
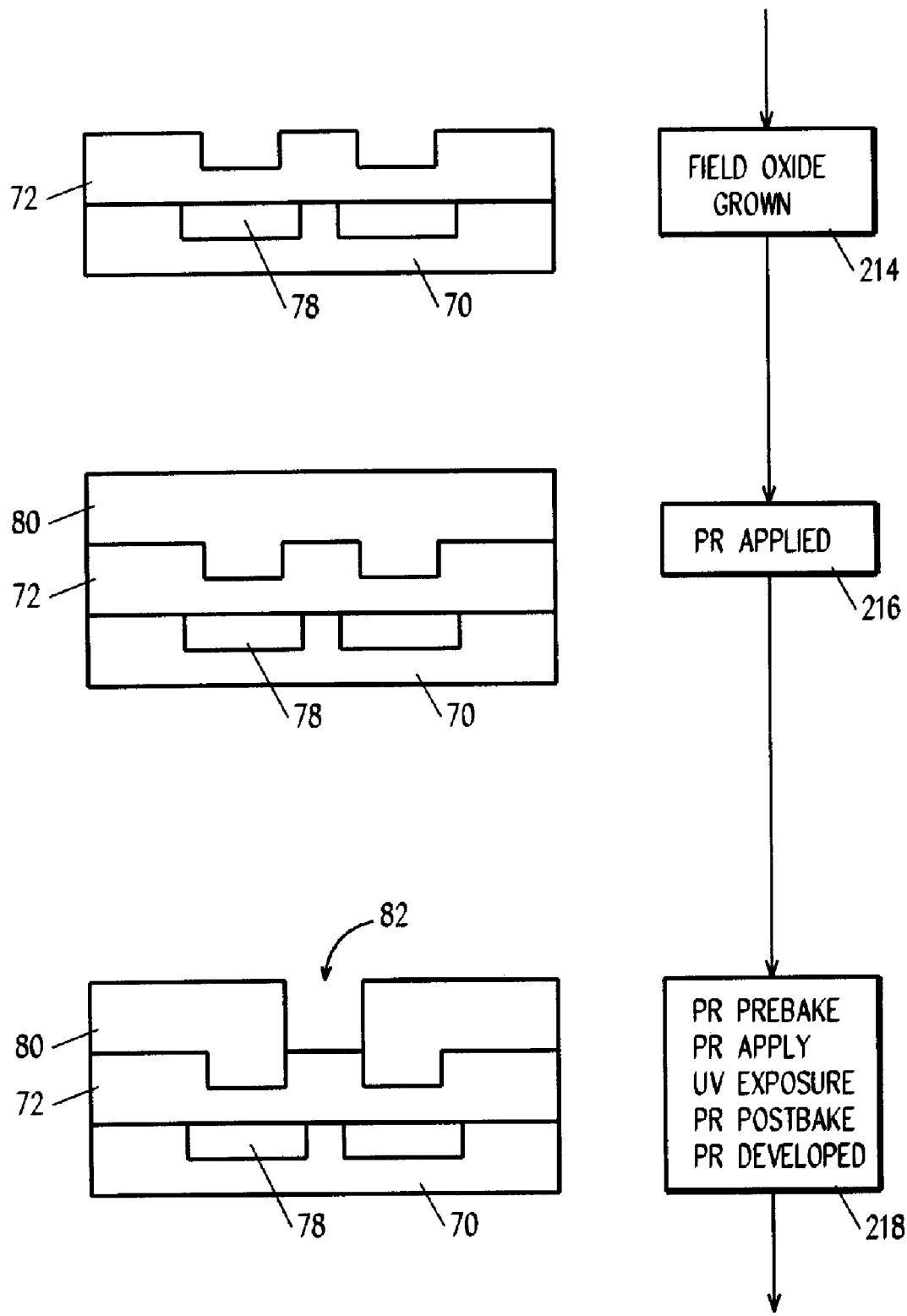
Figure 2D:
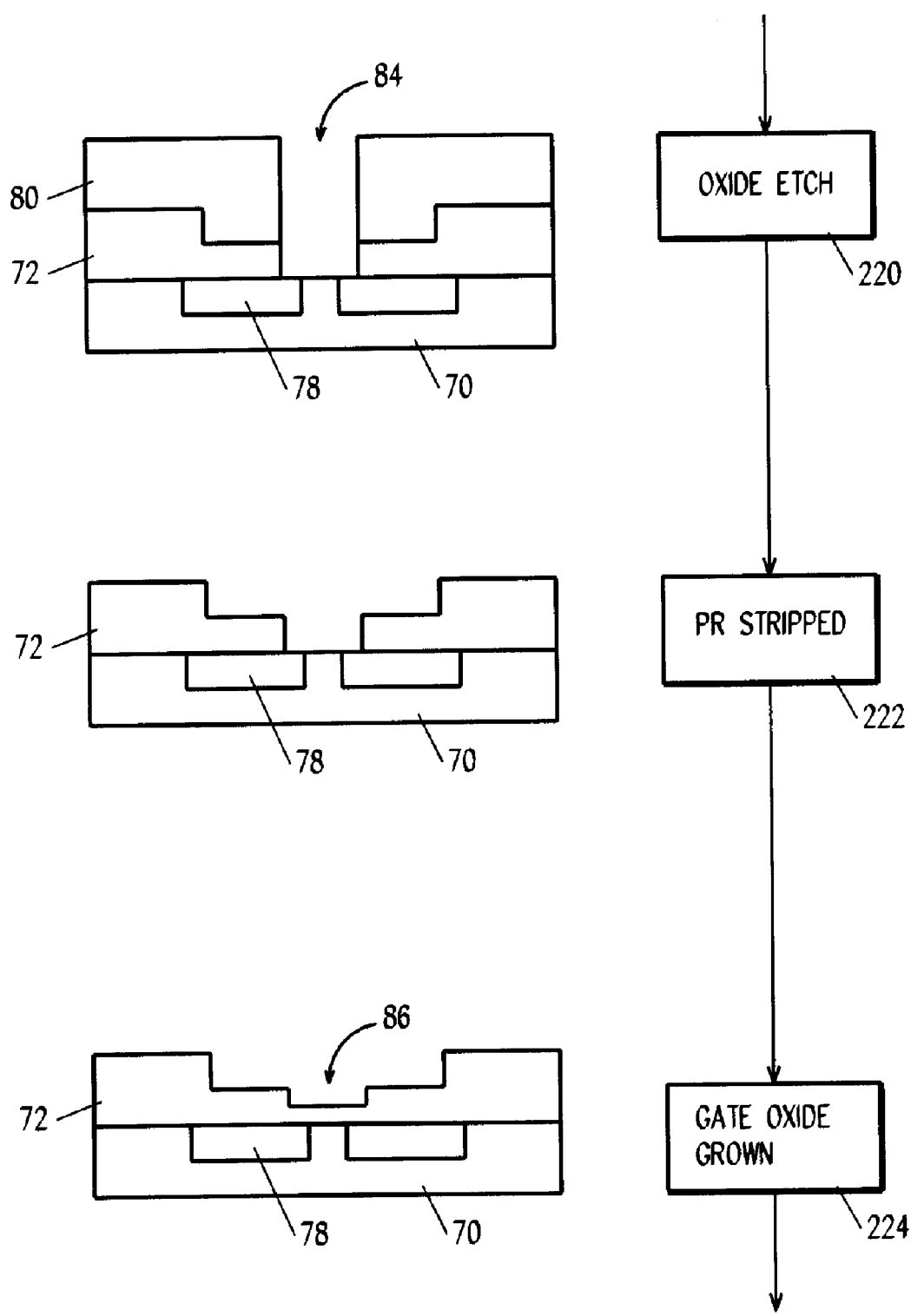
Figure 2E:
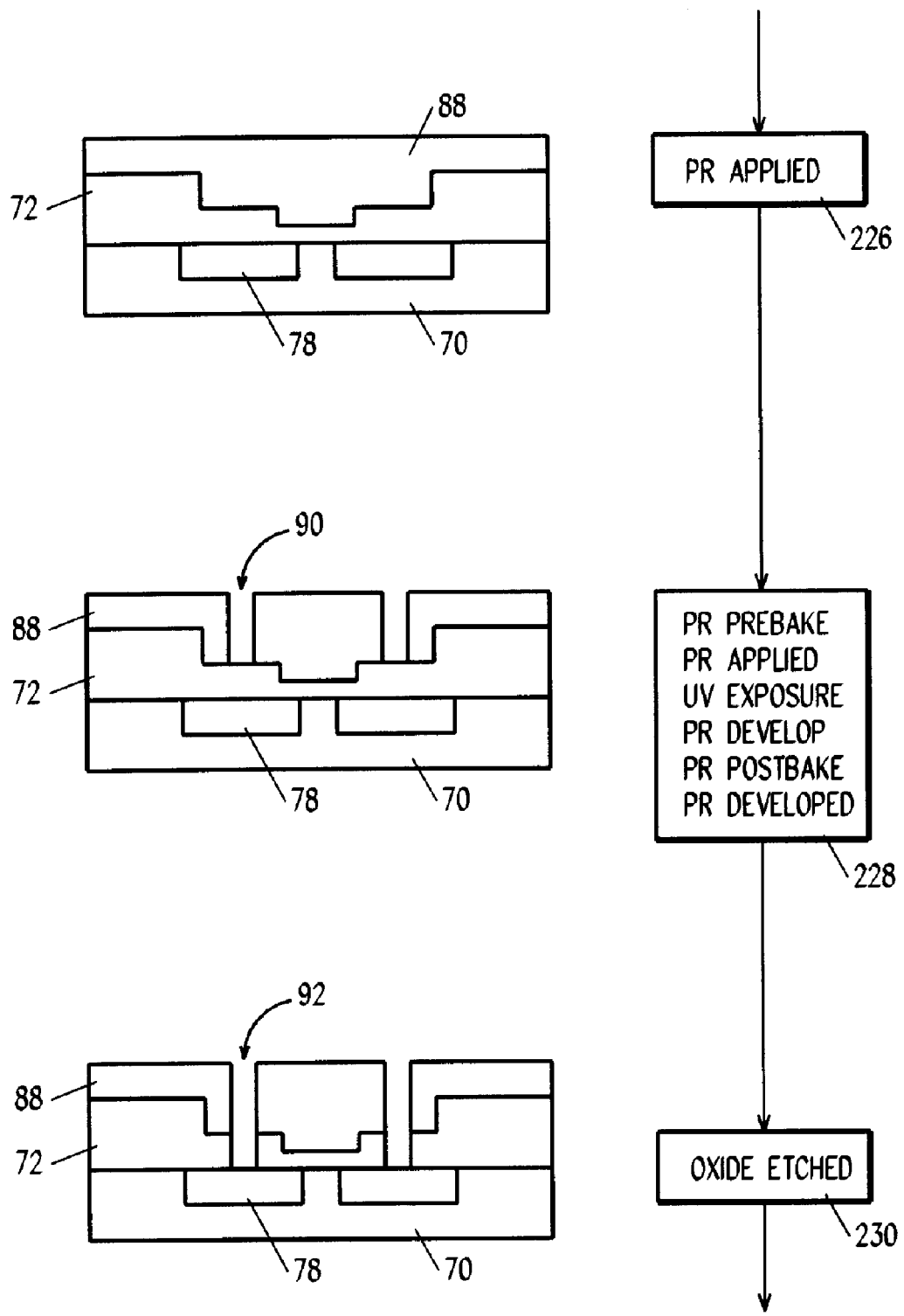
Figure 2F:
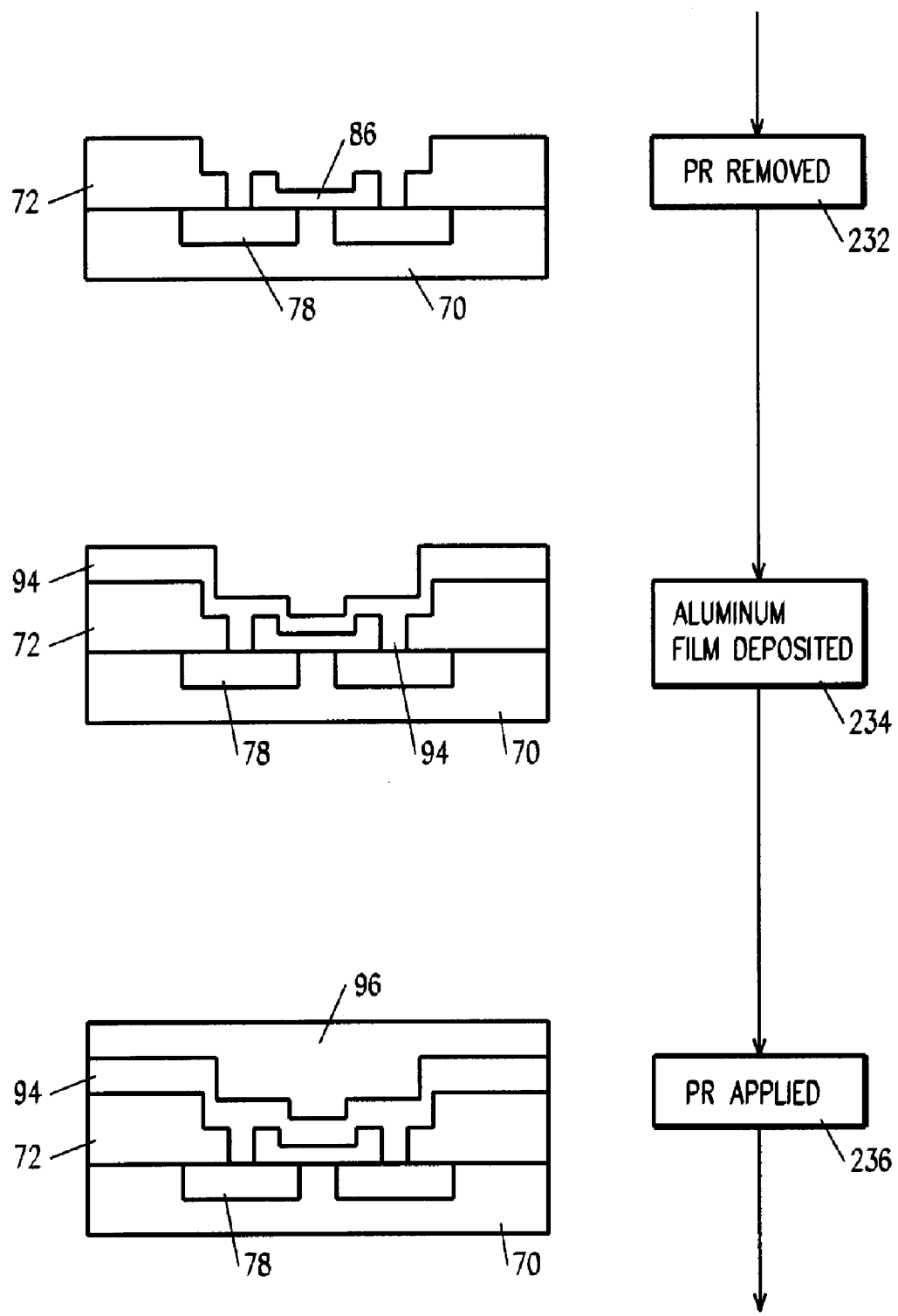
Figure 2G:
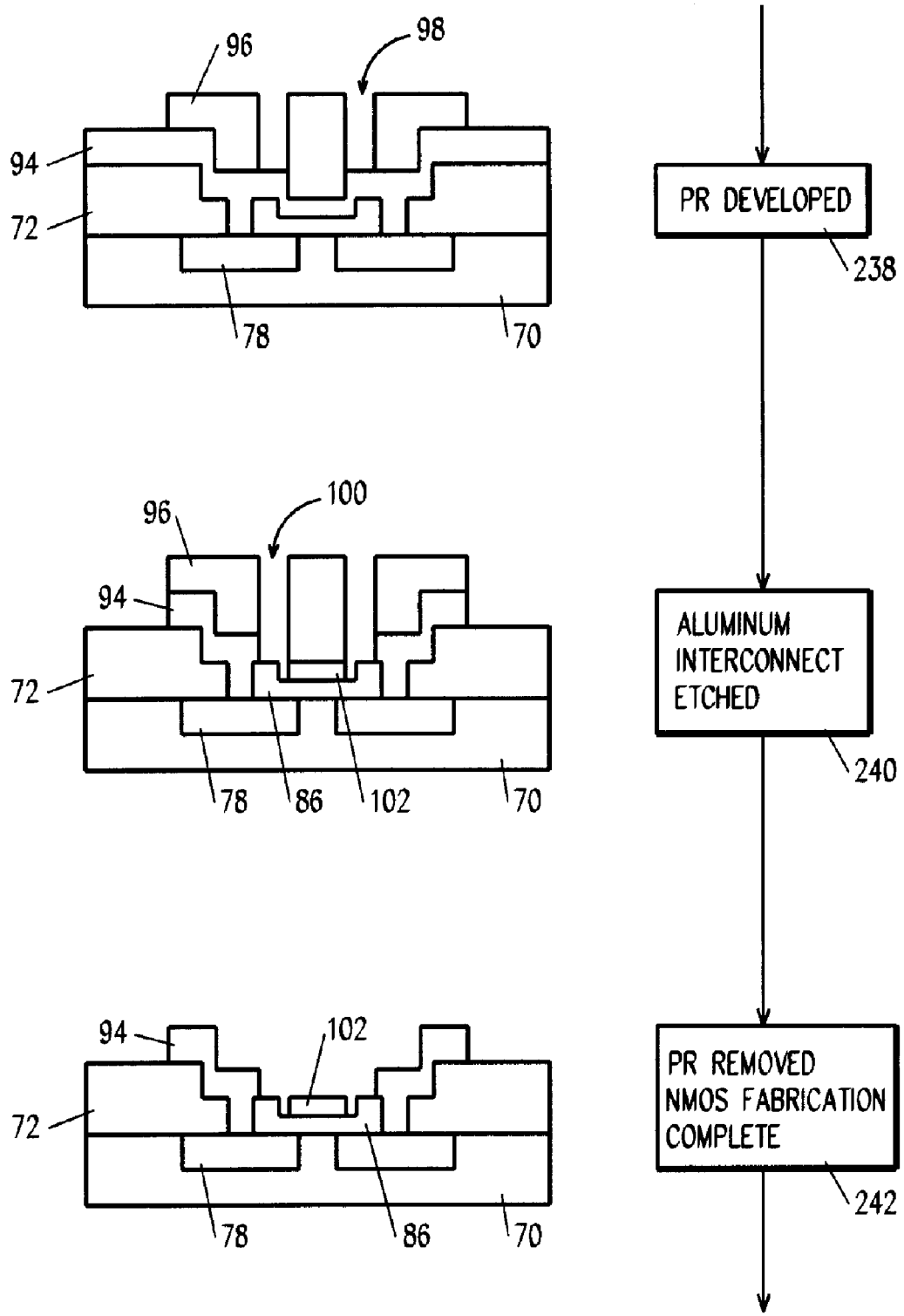

Referring to FIG. 1, a simple block diagram of an argon/nitrogen cryogenic aerosol tool for cleaning silicon wafers is illustrated. The aerosol process starts with argon 50 and nitrogen 52 gas. The volume of each gas is controlled individually by mass-flow controllers and mixed in blender 54 before entering cryogenic chiller 56. Chiller 56 is a liquid nitrogen heat exchanger that cools the gas mixture to cryogenic temperatures. This cooled mixture flows into an injection nozzle or expansion chamber 58, and then is injected into cleaning chamber 60 through an array of nozzle holes 48. Expansion of the gas into the vacuum chamber 58, which is controlled at a partial vacuum of 100–300 torr, causes further cooling. This leads to the formation of frozen crystals as the gas temperature drops below 84 K, the triple point for argon. Nitrogen in the gas mixture permits higher expansion ratios, and acts as a diluent for the argon, thus providing a means for controlling argon particle size and kinetic energy.

Wafer 40 passes under the nozzle and is sprayed with an aerosol comprising Ar/N2 mixture and argon ice crystals, which impinge on free standing structures 42. The injector nozzle angle of incidence 46 can be adjusted to optimize cleaning of high-aspect features. The intensity of the aerosol, energy, and size of the ice crystals are controlled by total gas flow, the ratio of argon to nitrogen, gas temperature, and chamber 60 pressure. The Aerosol process, such as an Aerosol clean process, is a simple momentum transfer process. ("P" is scientific notation for momentum.) Free-standing structures can be knocked over by transferring the momentum of frozen gas particles to them. The pressure applied to the gas behind the nozzle will change the momentum of the frozen gas particles. Pressure is one "knob" which can be turned to change the momentum. Other "knobs" which can be turned that allow for the tenability of the process are gas species and distance from nozzle to wafer.

Referring to FIGS. 2A through 2G, a typical semiconductor manufacturing process is illustrated, with various free standing structures 42 which may be tested using the aerosol clean process of the preferred embodiments of the invention occurring at several stages of the process.

In step 200, for an NMOS process, a starting material consisting of a P-type lightly doped, polished silicon wafer 70 is provided. In step 202, a SiO2 layer 74 is formed by thermal oxidation. In step 204, photoresist is applied, such as by dropping several drops of positive Photoresist (e.g. Shipley S1818) on the wafer, which is then spun to be uniformly spread out. After spinning, the wafer is given a pre-expose baking to remove solvent from the PR film 74 and improve adhesion to substrate 70.

In step 206 the drain and source regions 75 are defined by photolithography. The PR layer 74 portion not covered by a mask undergoes a chemical change by UV light and is removed by spraying the wafer with a developing solution. The remaining PR 74 is a copy of the mask pattern. The wafer is rinsed and spin dried, and then baked again so that PR 74 can resist a strong acid used to etch the exposed oxide layer.

In step 208, hydrofluoric (HF) acid is used to etch away the oxide in the openings 76 of the photo resist 74, and stops at the surface of silicon 70. In step 210, the photo resist 74 is stripped by solvent or plasma oxidation, leaving behind an insulator pattern 72 that is the same as the opaque image on a mask.

In step 212, a two-step diffusion process is used to form drain and source regions 78 in which phosphorous predeposition is first formed followed by a drive-in diffusion, and a thin layer of phosphosilicate glass on the wafer is removed. In step 214, oxide layer 72 is further grown from thermal oxidation. Phosphorous 78 spreads out by diffusion during this furnace operation.

In steps 216, 218, and 220, a second photolithography process is done to remove oxide 72 to define a gate region 84. This is done, as before, by photoresist 80 drop, spinning, pre-baking, mask alignment, UV exposure, PR developing, rinsing and drying, post-baking, and oxide 72 etching. In step 222, photoresist 80 is stripped.

In step 222, a very thin gate oxide layer 86 is grown by thermal oxidation. In steps 226, 228 and 230, a third photolithography process is done to remove oxide 72 to define contact holes 92. The same procedure is followed: PR 88 drop, spinning, pre-baking, mask alignment, UV exposure, PR 88 developing, rinsing and drying, post-baking, and oxide 72 etching. In step 232, PR 88 is removed.

In step 234, a metal such as Aluminum 94 is evaporate on the whole substrate surface to form electrical contacts later.

In steps 236, 238, and 240, a final lithography process is done to remove the Al-layer 94, defining a contact pattern. The same procedure is followed: PR drop, spinning, pre-baking, mask alignment, UV exposure, PR developing, rinsing and drying, post-baking, Al etching. In step 242, PR 96 is stripped, and all the NMOS fabrication steps are completed.

At several stages in the NMOS fabrication process, as in other such fabrication processes, free standing structures 42 are created which can be subjected to the aerosol clean process of the present invention for testing structural and electrical integrity (length of line width and continuity). These include, for example, PR 74 at step 206, oxide 72 at step 210, PR 88 at steps 228 and 230, oxide 86 at step 232, Al 94 at step 234, PR 96 at steps 238 and 240, and AL 94 at step 242.

Figure 3A:
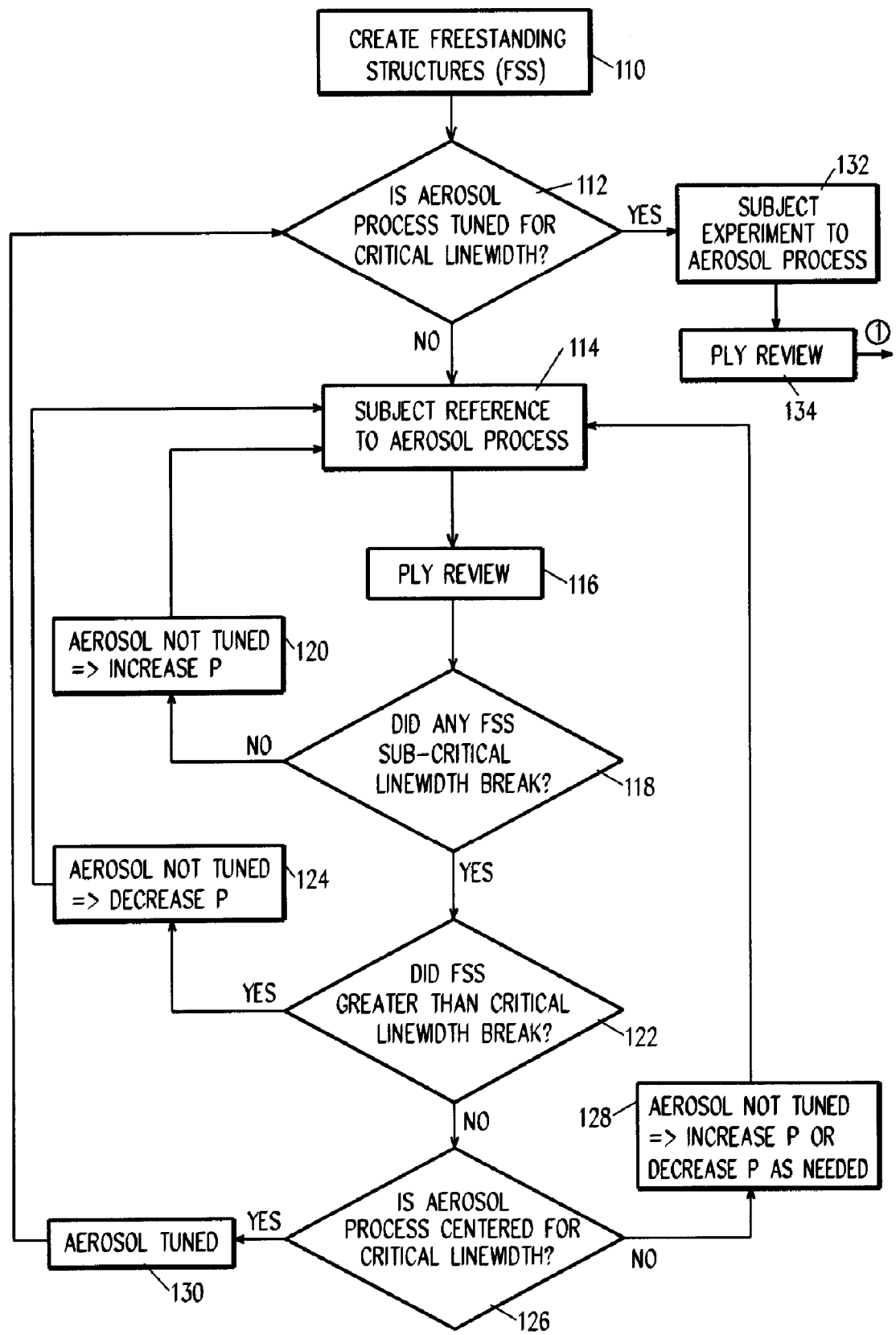
FIGS. 3A and 3B are a flow diagram of the process of the preferred embodiment of the invention for determining minimum line widths.
Figures 3, 3B:
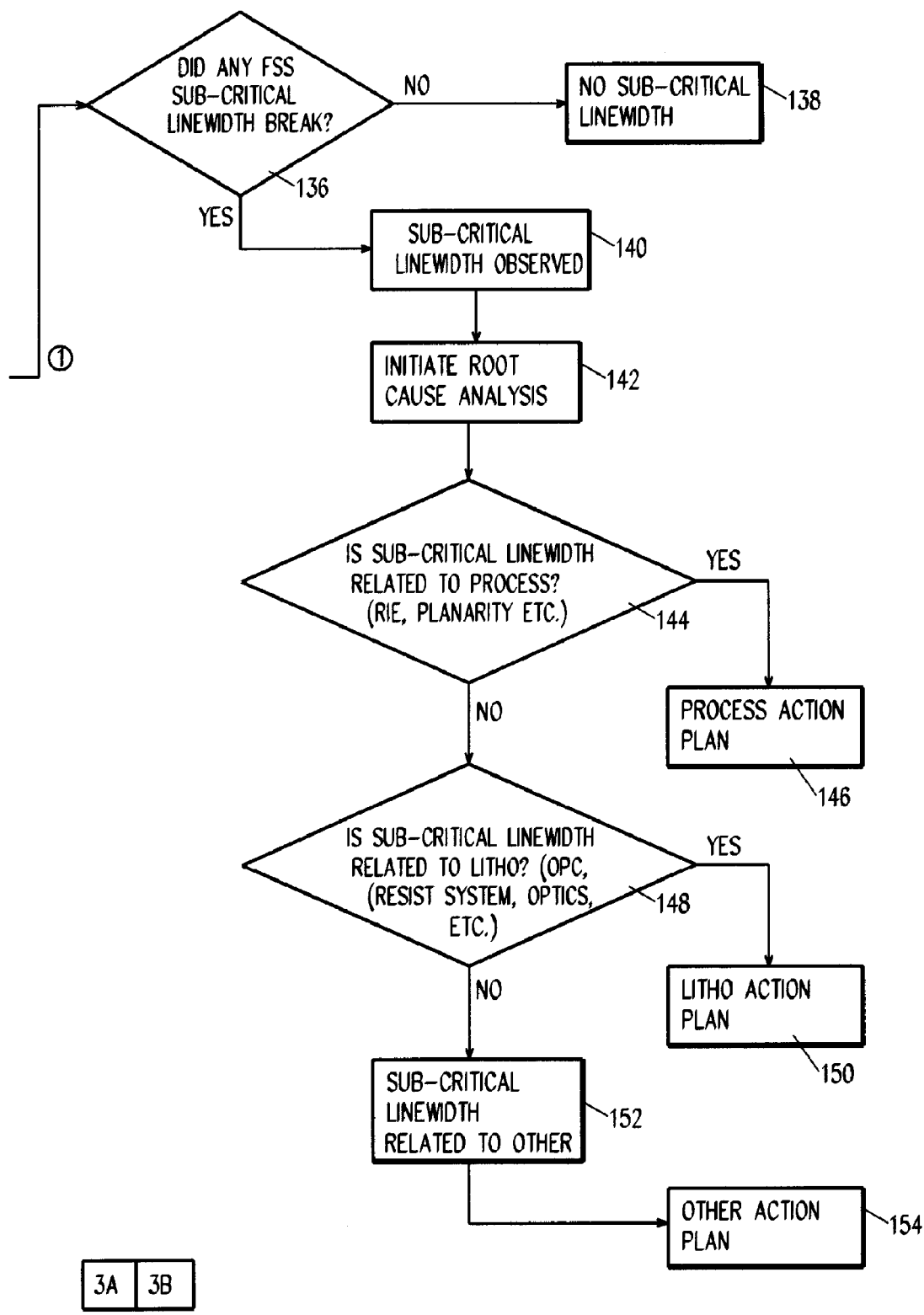

Referring to FIGS. 3A and 3B, process steps for determining minimum line widths begins in step 110 with creating freestanding structures, as previously described with respect to FIGS. 2A through 2G.

In step 112, it is determined if the aerosol process is tuned (or, has been tuned as a result of steps 114–130) for critical line width. Parameters to tune to control the intensity of the aerosol, energy, and size of the aerosol crystals include injector nozzle 48 angle of incidence 46, total gas flow into chamber 58, the ratio of argon 50 to nitrogen 52, gas temperature out of cooler 56, and chamber 60 pressure.

In step 114, free standing structures 42 on wafer or chip 40 are subjected to the aerosol process in chamber 60. In step 116, structures 42 are examined (by scanning electron microscope (SEM), or PLY) to determine in steps 118 and 122 if any free standing structures broke. If it is determined in step 118 that an FSS 42 of sub-critical line width broke, the aerosol process is not tuned and in step 120 parameters are tuned to increase aerosol pressure. If it is determined in step 122 that an FSS 42 of greater than critical line width broke, the aerosol process is not tuned, and in step 124 parameters are tuned to decrease aerosol pressure (that is, the force by which the aerosol impinges on FSS 42 during test). If FSS structures of less than or greater than critical line width did not break, then in step 126 it is determined if the aerosol process is centered for the critical line width. The aerosol process is centered for critical line width when freestanding structures start breaking just below the dimensions determined by the technology minimum line width. Whether or not the process is centered is determined by PLY inspection to determine where the lines are breaking and SEM inspection to determine at what width the lines are breaking.

If the aerosol process is centered for the critical line width, then step 130 indicates that the aerosol process is tuned and, if not, in step 128 the aerosol process is tuned by increasing or decreasing pressure as needed. The minimum line width is determined by the technology node. It is the smallest allowed freestanding structure width as determined by the design manual for the technology. Here the critical line width is the threshold value where the freestanding structures will start to break as determined by where the aerosol process is tuned.

Figure 4:
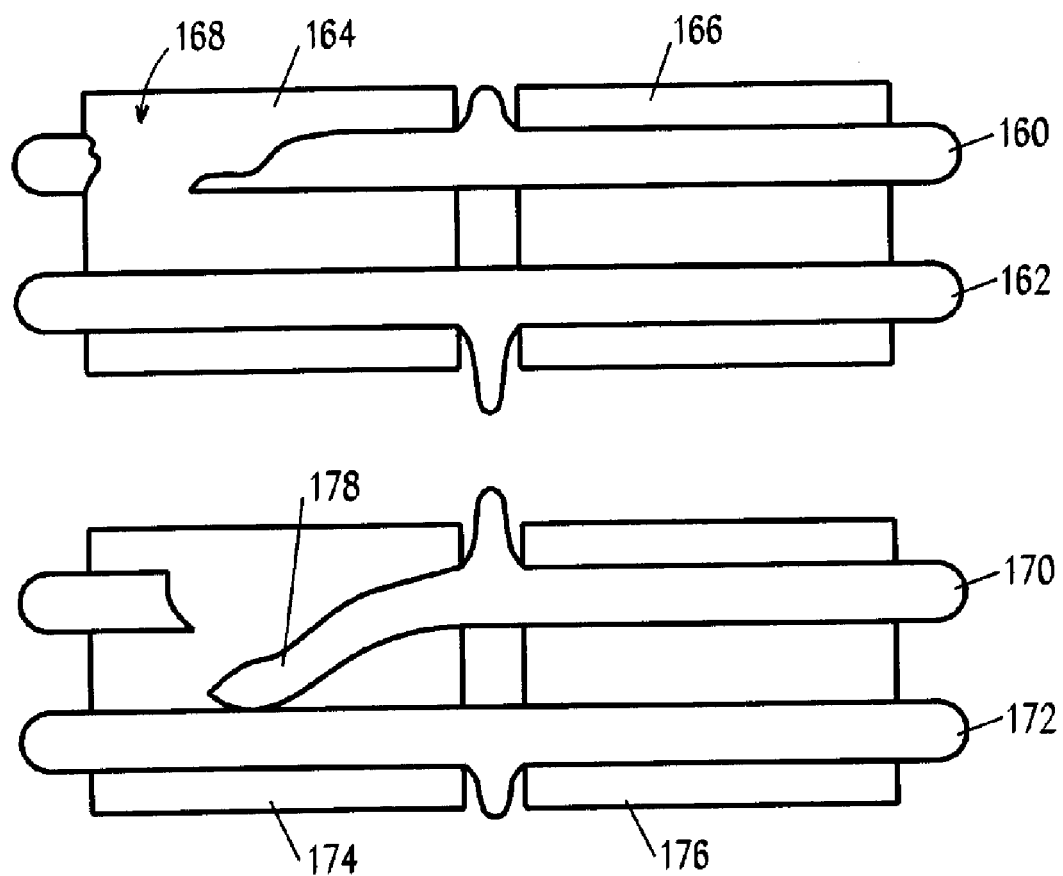
FIG. 4 is a schematic representation of a scanning electron microscope (SEM) view of free standing structures (FSS).
Figure 5:
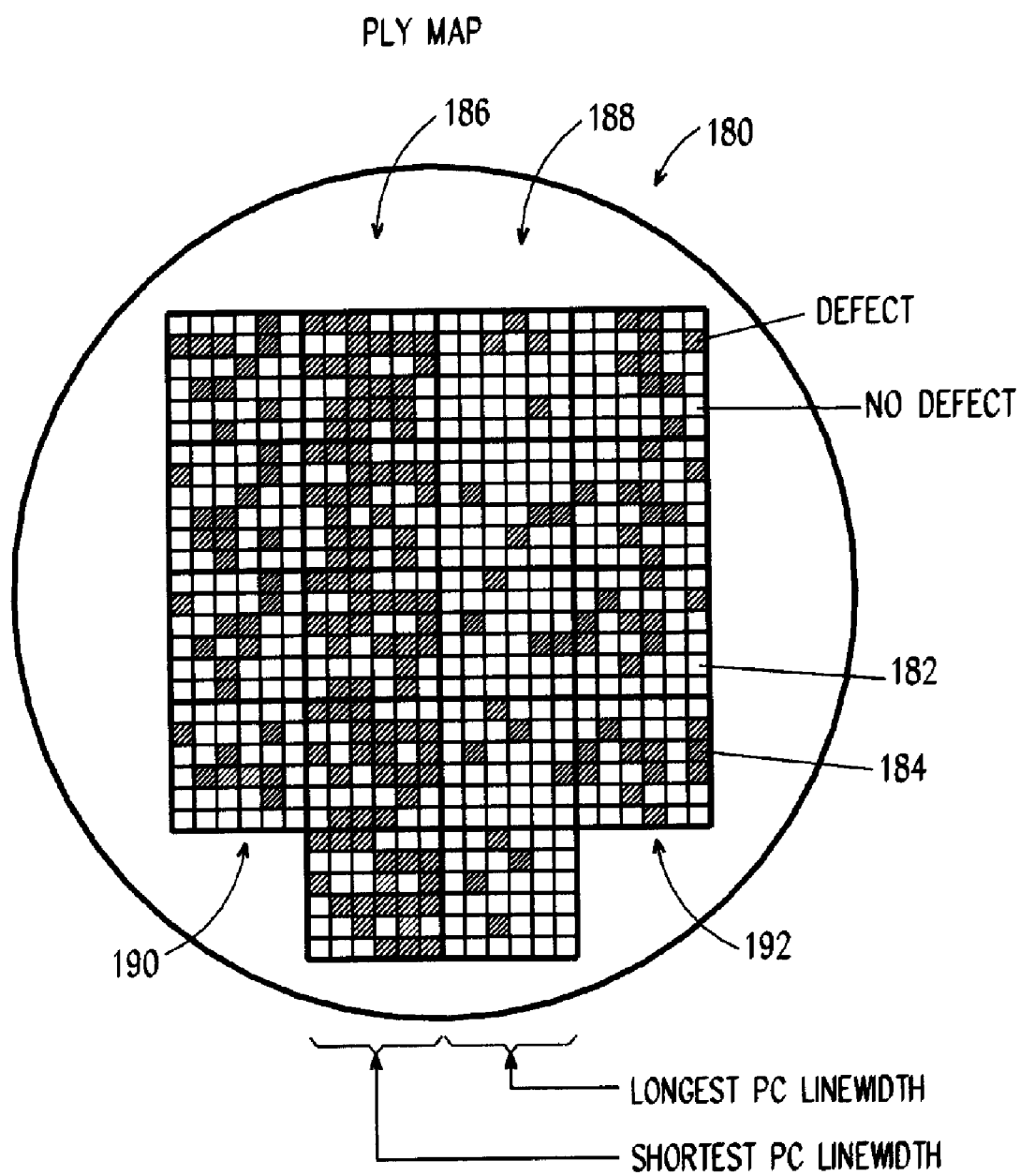
FIG. 5 is a schematic representation of a Process Limited Yield (PLY) map of a semi-conductor chip which has been subjected to the aerosol clean/inspection process of the preferred embodiment of the invention.
Figure 6:
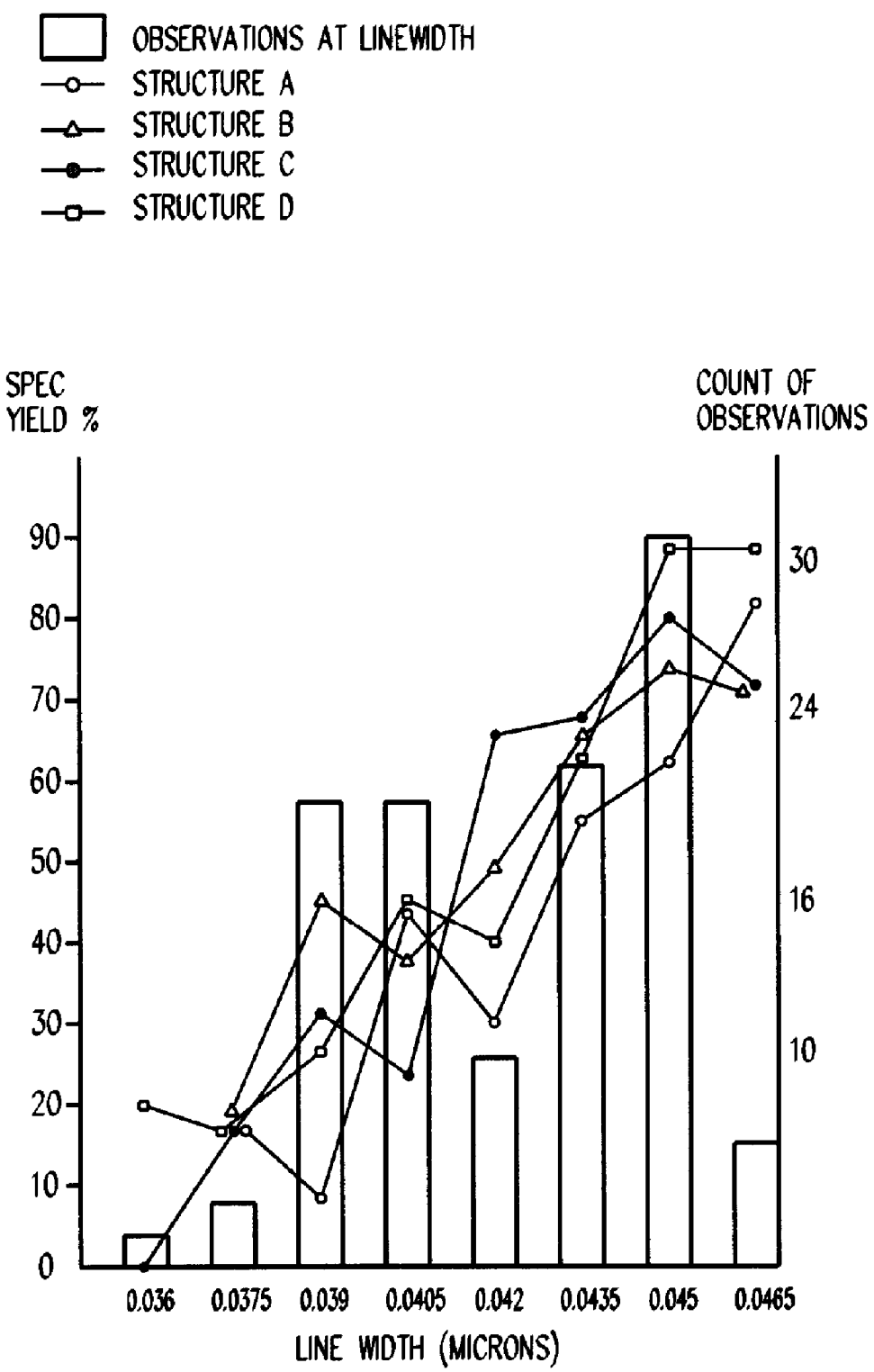
FIG. 6 is a bar and line chart illustrating yield for four exemplary free standing structures.

Once it is determined in step 112 that the aerosol process has been tuned for the critical line width of the FSS 42 to be tested, in step 132 the test is conducted and in step 134 the results examined. FIG. 4 is a representation of a scanning electron microscope (SEM) view of test results, FIG. 5 is a schematic representation of a PLY map of results, and FIG. 6 plots the results of observations of four exemplary structures 42 at various line widths.

Referring to FIG. 3B, in step 136 it is determined if any free standing structures (FSS) of sub-critical line width broke, and if not, step 138 indicates that there are none. Step 140 indicates that sub-critical line widths have been observed, and in step 142 root cause analysis is undertaken. A sub-critical line width is observed when a line is determined to be below minimum acceptable width because it broke when subjected to a process tuned to the center of the critical line width.

In steps 144 and 146, a process correction action plan is designed to correct for the manufacture of sub-critical line width related to such process steps or parameters as Reactive Ion Etch (RIE) and planarity. RIE is a process where reactive gases in plasma form will chemically etch away specific materials. Planarity refers to how planar the surface is that the FSS is landing. If the surface is not planar (varying in height by a few nanometers) the lithographic process will not print the FSS pattern correctly and can result in a sub-critical feature. Once the substructure is located and imaged (with an SEM) the problematic structure can be traced back to which manufacturing process caused the problem depending on what the faulty FSS looks like. Lithographic issues have a different signature than RIE issues than OPC issues.

In steps 148 and 150, a lithography corrective action plan is designed to correct for sub-critical line width issues related to lithography, including for example Optical Proximity Correction (OPC), resist system, optics. OPC is a method for adding or subtracting extra features in a lithographic mask to make the features print to the desired shape. Herein, optics refers to the lithographic tools itself and, if the tool is printing sub-critical line width features, a change in the process of the lithographic tool may be necessary.

In steps 152 and 154, an action plan is designed to handle sub-critical line width results not related to process or lithography.

Referring to FIG. 4, a schematic representation is presented of a scanning electron microscope examination of free standing structures 160, 162, 170, 172 which have been subjected to aerosol cleaning. These exemplary structures are free standing on PC elements 164, 166, 174 and 176, which are surface structures on wafer or chip 40. Structure 160 has been broken at 168. Structure 170 has been broken, and portion 178 moved into contact with structure 172.

Referring to FIG. 5, a schematic representation of a PLY map illustrates the results of testing a chip 180 which has been subjected to aerosol cleaning. A failure (that is, a damaged FSS 42) in a component is represented by a blackened square 184, with white squares 182 representing absence of a failure. In this example, column 186 contains structures with the shortest PC line widths and the largest density of structures broken by aerosol cleaning; column 188 contains structures with the longest PC line widths and the lowest density of structures broken (knocked over, evaporated or moved) by aerosol cleaning; and columns 190, 192 contain structures of intermediate line widths and failure density.

Each broken line 160, 170 in FIG. 4 is represented by a defect indicator 184 in PLY map 180.

Referring to FIG. 6, observations of four exemplary electrical structures are graphed with respect to yield and count of observations. Results are bucketized with the minimum line width of a bucket indicated in microns. The lines represent yield, the bars number of observations. These test structures 42 have been measured in line by observations taken at various points in the manufacture process. This chart illustrates that the longer the line width, the higher the yield, and also shows that with aerosol process tuning (such as pressure, flow rate) free standing structures of poly-Si lines below 30 nm could be knocked over. FIG. 6 is based solely on electrical data. A root cause (steps 144 cannot be determined without doing a root cause analysis like physical failure analysis. FIG. 6 represents electrical confirmation that the aerosol process (112) is being tuned.

It is an advantage of the present invention that a system and method is provided for identifying specific regions on a wafer or chip where free standing structures fail to maintain structural integrity.

It will be appreciated that, although specific embodiments of the invention have been described herein for purposes of illustration, various modifications may be made without departing from the spirit and scope of the invention. In particular, it is within the scope of the invention to provide a computer program product or program element, or a program storage or memory device such as a solid or fluid transmission medium, magnetic or optical wire, tape or disc, or the like, for storing signals readable by a machine, for controlling the operation of a computer according to the method of the invention and/or to structure its components in accordance with the system of the invention.

Further, each step of the method may be executed on any general computer, such as IBM Systems designated as zSeries, iSeries, xSeries, and pSeries, or the like and pursuant to one or more, or a part of one or more, program elements, modules or objects generated from any programming language, such as C++, Java, PI/1, Fortran or the like. And still further, each said step, or a file or object or the like implementing each said step, may be executed by special purpose hardware or a circuit module designed for that purpose.

Accordingly, the scope of protection of this invention is limited only by the following claims and their equivalents.

What is claimed is:

1. Method for determining minimum line widths of free standing structures built by a semiconductor manufacturing process, comprising:
   creating free standing structures in a semiconductor process;
   tuning and centering an aerosol process with respect to a critical line width for said free standing structures;
   subjecting said free standing structures to said aerosol process; and
   responsive to failure of said free standing structures of sub-critical line widths, selectively tuning said semiconductor manufacturing process.

2. The method of claim 1, further comprising:
   creating and testing said free standing structures at a plurality of steps in said semiconductor manufacturing process.

3. The method of claim 1, said semiconductor manufacturing process including process and lithography steps.

4. Method for evaluating a semiconductor manufacturing process, comprising:
   creating free standing structures using said semiconductor manufacturing process;
   subjecting said free standing structures to an aerosol process;
   tuning said aerosol process to a critical line width by:
      responsive to failure of a free standing structure of sub-critical line width, tuning said aerosol process to increase aerosol pressure;
      responsive to failure of a free standing structure of greater than critical line width, tuning said aerosol process to decrease aerosol pressure; and
      centering said aerosol process for critical line width; and
   testing said semiconductor manufacturing process by subjecting said free standing structures to a tuned aerosol process; and
   responsive to failure of said free standing structures of sub-critical line widths, selectively tuning said semiconductor manufacturing process.

5. Method for evaluating a semiconductor manufacturing process, comprising:
   creating free standing structures using said semiconductor manufacturing process;

subjecting said free standing structures to an aerosol process;
responsive to failure of a free standing structure of sub-critical line width, tuning said aerosol process to increase aerosol pressure;
responsive to failure of a free standing structure of greater than critical line width, tuning said aerosol process to decrease aerosol pressure, said aerosol comprising argon and nitrogen gas; and
centering said aerosol process for critical line width.

6. The method of claim 5, said tuning comprising selectively increasing and decreasing aerosol pressure by controlling total gas flow, ratio of argon to nitrogen, gas temperature, and chamber pressure.

7. The method of claim 4, further comprising creating and evaluating said free standing structures at a plurality of stages of said semiconductor manufacturing process.

* * * * *